US012585850B1

(12) United States Patent
Vinchure et al.

(10) Patent No.: US 12,585,850 B1
(45) Date of Patent: Mar. 24, 2026

(54) CASCADED-SCENARIO LOGIC ANALYZER

(71) Applicant: Astera Labs, Inc., Santa Clara, CA (US)

(72) Inventors: Hemant Vinchure, San Jose, CA (US); Anh T. Tran, Elk Grove, CA (US); Ken (Keqin) Han, Fremont, CA (US)

(73) Assignee: Astera Labs, Inc., San Jose, CA (US)

( * ) Notice: Subject to any disclaimer, the term of this patent is extended or adjusted under 35 U.S.C. 154(b) by 536 days.

(21) Appl. No.: 18/108,341

(22) Filed: Feb. 10, 2023

(51) Int. Cl.
*G06F 30/3323* (2020.01)
(52) U.S. Cl.
CPC ............................... *G06F 30/3323* (2020.01)
(58) Field of Classification Search
CPC .................................................. G06F 30/3323
See application file for complete search history.

(56) References Cited

U.S. PATENT DOCUMENTS

| | | | |
|---|---|---|---|
| 6,564,347 B1 * | 5/2003 | Mates ................ | G01R 31/3177 |
| | | | 714/724 |
| 9,098,486 B1 * | 8/2015 | Tan .......................... | G06F 11/27 |
| 10,740,002 B1 | 8/2020 | Aden et al. | |
| 2018/0300083 A1 | 10/2018 | Volos et al. | |

* cited by examiner

*Primary Examiner* — Nghia M Doan
(74) *Attorney, Agent, or Firm* — Charles Shemwell

(57) ABSTRACT

A chip-embedded logic analyzer autonomously sequences between logic analysis scenarios, dynamically revising match criteria and match-responsive behavior as match conditions for each successive scenario are met. Through this cascading-scenario operation, the logic analyzer may log selected debug vectors as and/or after complex sequences of device conditions unfold, enabling substantially more targeted and sophisticated operational debugging than conventional trigger-and-log analyzers.

21 Claims, 4 Drawing Sheets

Embedded, Cascading-Scenario Logic Analyzer

FIG. 1 Embedded, Cascading-Scenario Logic Analyzer

Cascading Analyzer

Control FSM

Cascaded Search
Example A

Cascaded Search
Example B

Cascaded Search
Example C

CASCADED-SCENARIO LOGIC ANALYZER

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments herein a chip-embedded logic analyzer autonomously sequences between logic analysis scenarios, dynamically revising match criteria and match-responsive behavior as match conditions for each successive scenario are met. Through this cascading-scenario operation, the logic analyzer may log selected debug vectors as and/or after complex sequences of device conditions unfold, enabling substantially more targeted and sophisticated operational debugging than conventional trigger-and-log analyzers.

Figure 1:
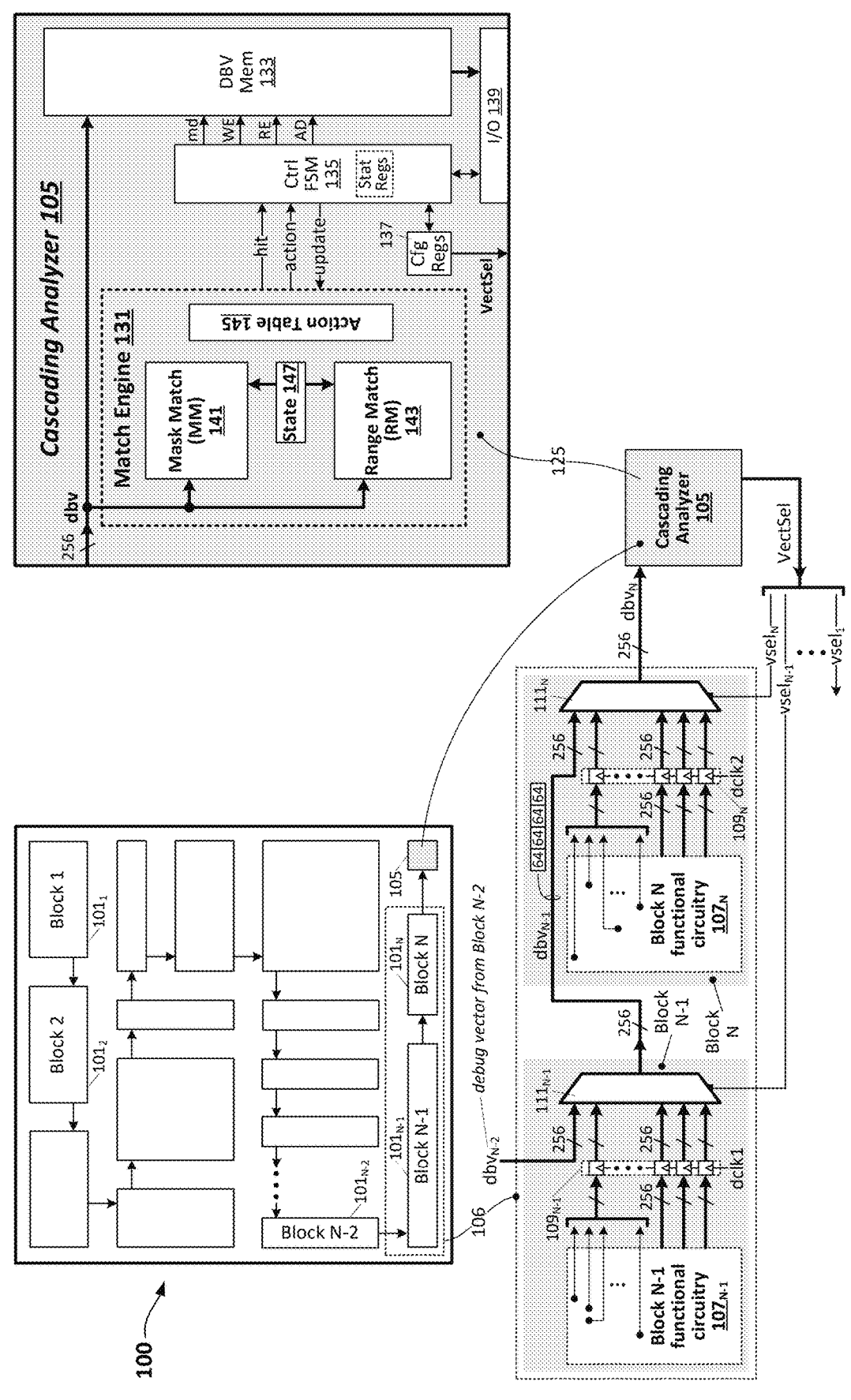
FIG. 1 illustrates an integrated circuit component having various functional circuit blocks together with an embedded, cascading-scenario logic analyzer.

FIG. 1 illustrates an integrated circuit component 100 having various functional circuit blocks ($\mathbf{101_1}$-$\mathbf{101_N}$—collectively, 101) together with an embedded, cascading-scenario logic analyzer 105 ("cascading analyzer"). Referring to detail view 106, each of the functional blocks 101 includes functional circuitry (e.g., $\mathbf{107_{N-1}}$, $\mathbf{107_N}$) that implements mission-mode and/or diagnostic operations within the host IC, generating various time-varying signals (e.g., control signals, data signals (including signals indicative of operational state), address signals, etc.) in connection with those operations—in many cases, signals triggered directly or indirectly in response to complex/unpredictable sequences of inputs from sources external to the IC (e.g., commands, addresses, control signals, data, etc., received via one or more interfaces from another IC within a host system) and thus time-varying combinations of internal signal states that (i) may yield unexpected/undesired device and/or system behavior (e.g., failure, compromised performance, etc.) and (ii) are exceedingly difficult to identify and reproduce for debugging/analysis purposes. By embedding cascading-scenario analyzer 105 within IC 100 together with circuitry for sampling signals of interest within respective functional blocks-aggregations of such signal samples constituting "debugging vectors" in which constituent bits correspond to individual signal states at the sampling instant—and vector delivery circuitry for conveying programmably-selected debug vectors within any or all of the functional circuit blocks to analyzer 105, complex sequences of debugging vectors corresponding to signal-state scenarios of interest may be detected and selectively logged. In the particular embodiment shown, signals of interest within each functional block 101 are aggregated into 256-bit debug vectors (each of which may be organized in four 64-bit slots and eight 32-bit chunks) which are captured within sampling registers ($\mathbf{109_{N-1}}$, $\mathbf{109_N}$) in response to a sampling clock (various different sampling clocks, dclk1, dclk2, . . . may correspond to various different mesochronous and/or plesiochronous timing domains, including one or more domains operating at a subdivided frequency of one or more other domains) and then selected via per-block vector-select multiplexer ($\mathbf{111_{N-1}}$, $\mathbf{111_N}$). The vector-select multiplexer (collectively, 111) within each functional block outputs a selected debug vector from the host block to an input of the vector-select multiplexer of a subsequent block, thus effecting a daisy-chained vector delivery path that extends through all functional logic blocks 101 to analyzer 105 (i.e., from initial block $\mathbf{101_1}$ through final block $\mathbf{101_N}$ and from the final block to analyzer 105) and that allows, via a multi-field vector-select address (VectSel) output from analyzer 105 to the vector-select multiplexers (i.e., each multiplexer receiving a component field of the vector-select address: $vsel_1$, $vsel_2$, . . . $vsel_{N-1}$, $vsel_N$) selection of any debug vector from any functional circuit block to be programmably selected as the debug vector delivered to cascading analyzer 105. In a number of embodiments, the component fields of the vector-select address each include a pair of subfields that control, respectively, the debug vector selection within a given multiplexer 111 and a merging of slots (e.g., 64-bit subfields of a given 256-bit debug vector) from two or more input vectors—including input vectors from diverse functional blocks 101—to form a composite output vector. Thus, the final debug vector supplied to cascading analyzer 105 may be a composite of four 64-bit debug vector slots, with each of those slots drawn from any debug vector within any of the N functional circuit blocks 101. In alternative embodiments, the relative sizes of the slots (or debug vector sub-fields) and full debug vector may vary so that more or fewer than four slots per debug vector may be supported.

In a number of embodiments, cascading analyzer 105 operates in a timing domain corresponding to the fastest of the timing domains within the various functional circuit blocks 101 and includes a vector analysis engine capable of evaluating inbound debug vectors in real time—that is, evaluating and taking various actions in response to a given debug vector in each cycle of the analyzer domain clock—referred to herein as a search cycle or debug cycle—and thus enabling logic analysis at the full operational speed of the host IC. In some embodiments, successive operational stages of the vector analysis (e.g., match detection stage to detect an instance of a vector of interest, followed by an action stage to execute one or more specified actions in response to detection of the vector of interest) are executed in sequential debug cycles, to effect a pipelined vector analysis. Also, though not specifically shown in FIG. 1, timing alignment buffers may be implemented within functional circuit blocks 101 to levelize vectors selected from functional logic blocks at different depths within the daisy-chained vector selection architecture (e.g., so that a vector having a 64-bit slot filled from signals sampled in one functional circuit block are timewise-aligned with those filled from signals sampled in a subsequent functional circuit block within the functional block daisy chain). More generally, the vector selection architecture shown in FIG. 1 may vary in numerous respects, including provision for partially or fully parallel (rather than daisy-chained) vector delivery to analyzer 105, sampling of selected signals at the output of a given vector-select multiplexer 111 rather than at the multiplexer inputs (i.e., to reduce the number of sampling registers and/or sampling power consumption), provision for programmably-selected/scaled debug vector size and/or slot size (e.g., debug vector greater than/less than 256 bits; slot size greater than/less than 64 bits), and so forth.

In one embodiment, shown for example in detail view 125, cascading analyzer 105 includes a match engine 131 and debug memory 133—both coupled to receive a new debug vector ("dbv") in each debug cycle—together with a controller 135 (e.g., implemented by a finite state machine, sequencer, programmed processor, etc.), configuration storage 137 (e.g., one or more registers) and input/output port 139 ("I/O"). Match engine 131 includes mask match and range match circuitry (141, 143) that collectively search the incoming vector stream for debug vectors of interest—outputting a "hit" signal to controller 135 for each incoming debug vector determined to meet one or more pre-stored "search vectors" and deasserting the hit signal for all other (non-matching) debug vectors. Instead of merely transmitting hit/miss status to controller 135, however, match engine 131 additionally performs a lookup within an action table 145, retrieving an action vector corresponding to the search vector that yielded the debug-vector match and outputting that action vector to controller 135 together with the hit signal assertion. The controller 135, in turn, responds to each search hit by executing the action(s) specified within the corresponding action vector, thus enabling a broad variety of operations as debug vectors of interest are sequentially identified—including dynamic modification to the search criteria within match engine 131 so as to change the scenario of interest (e.g., states of selected signals within the host IC at any point in time) as a debugging session progresses—effectively cascading from one search scenario to another before commencing and/or stopping debug vector capture within debug memory 133 (i.e., vector logging or storage). Accordingly, match engine 131 and controller 135 cooperatively enable debug vector capture after an extended sequence of complex scenarios have been confirmed (i.e., detected) and thus identification and evaluation of problems/behaviors that are otherwise exceedingly difficult to detect. When combined with available test vector loading (e.g., the host IC may have a JTAG or other standardized and/or proprietary testing interface that enables reproduction of various device testing scenarios), the cascaded-scenario debugging likewise enables test-environment data capture following a cascaded sequence of scenarios and thus confirmation of desired operation (otherwise difficult or practicably infeasible) in response to complex sequences of events and conditions.

Still referring to detail view 125 (FIG. 1), controller 135 responds to hit signal assertion by executing the corresponding action, including updating one or more search vectors within match engine 131 (e.g., enabling/activating a previously stored but otherwise disabled/inactive search vector, disabling a search vector, revising a search vector), updating one or more analyzer status registers (i.e., registers accessible to functional components of host IC and/or host system via I/O port 139), updating data within configuration registers 137, for example, to dynamically revise the vector selection from one scenario search to the next, enabling debug vector storage—including storage of one or more metadata values ("md") associated with the dbv match detection—within debug vector memory 133 (e.g., asserting write-enable signal WE and sequencing address/pointer value AD), and so forth. The controller may also respond to incoming host commands (e.g., received via I/O port 139) to update contents of configuration registers 137 (writing configuration settings received via I/O port 139 into the configuration registers) and/or match engine 131, output status register content and/or enable readout of all or any selected content logged within debug memory 133 (e.g., asserting read-enable signal RE together with an address value (AD) or progressive sequence of address values). With regard to updating match criteria (in response to host commands and/or hit-associated action vectors), controller 135 may enable and/or disable matching with respect to specified search vectors within mask match 141 and/or range match circuits 143, load (or update) exact match and/or mask components of a search vector into mask match circuit 141, load (or update) range definition, chunk-select (as discussed below) and/or mask components of a search vector into range circuit 143, enable, disable and/or load/update state match fields within mask-match/range-match search vectors, load new content into a state table 147 (used to qualify debug vector match results as discussed below), and/or load or update action vectors within the action table itself. Accordingly, the debug vector search criteria and thus logic-state scenario of interest may be varied following each or any of a succession of hits within match engine 131, thus enabling detection of particular events after a complex and dynamic set of conditions have been satisfied.

Figure 2:
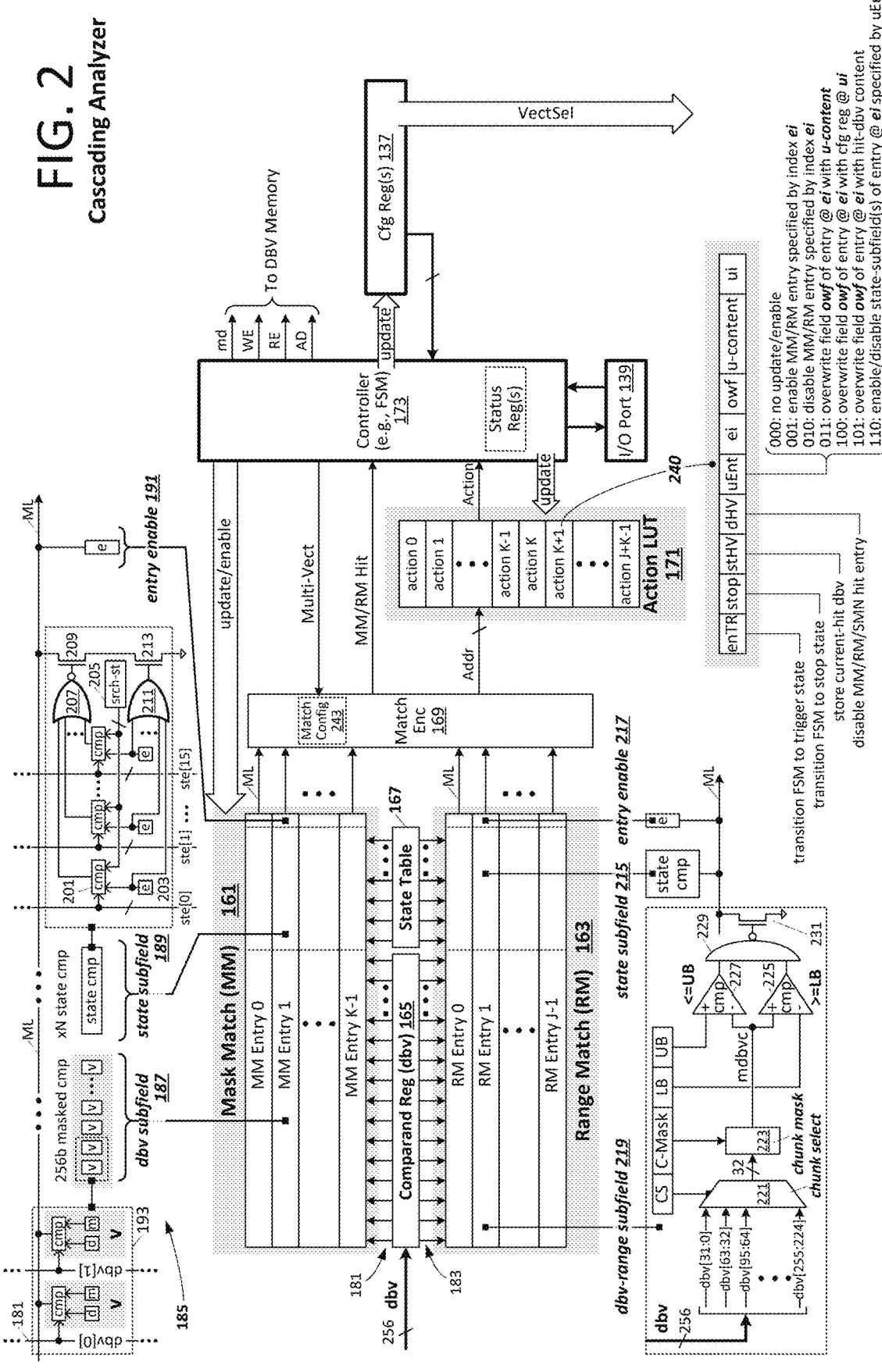
FIG. 2 illustrates a more detailed embodiment of a cascading-scenario logic analyzer that be deployed as the cascading analyzer of FIG. 1.

FIG. 2 illustrates a more detailed embodiment of a cascading analyzer (e.g., that may implement cascading analyzer 105 in FIG. 1) having a mask match circuit 161, range match circuit 163, comparand register 165, state table 167, match encoder 169, action lookup table (LUT) 171, controller 173, configuration register bank and I/O port. In the depicted example, incoming debug vectors are sequentially loaded into comparand register 165 to form, for each of a sequence of search cycles (or debug cycles), a respective comparand (compare value) that is applied simultaneously to the mask match and range match circuits (161, 163) via compare lines 181/183 (i.e., each compare value being applied to both mask match circuit 161 and range match circuit 163 in each search cycle or "debug cycle"). In one embodiment, the debug-vector comparand is supplemented by contents of state table 167—each state table entry being driven, for example, onto a respective subset of compare lines 181 and 183 so that all state table entries are applied in parallel to the mask match and range match circuits, thus effecting a compound comparand value that includes debug vector and state-table subfields.

Referring to detail view 185 (FIG. 2), each mask match entry ("entry" referring in alternate contexts herein to a search-vector storage-and-compare circuit or to the search vector itself) includes debug-vector and state-table store-and-compare subfields 187, 189 together with an entry-enable circuit 191. In the depicted example, the debug vector subfield includes a 256-bit ternary search circuit in which each search element 'V' includes a vector data bit store (d), vector mask bit store (m) and comparator (cmp) as shown at 193. The comparator is coupled to a match line (ML) for the mask-match entry, and includes logic gates to pull the match line low—and thereby signal a mismatch—if (i) the mask bit indicates an unmasked entry and (ii) the vector data bit and incoming comparand bit (i.e., a bit of the debug vector driven onto compare line 181 by comparand register 165) have different logic states (e.g., effecting a switched path to ground via comparator 'cmp' to pull the match line down). Conversely, if the mask bit is set to a masked logic state (i.e., masking any mismatch) or the incoming debug vector bit (on compare line 181) and search bit have matching logic states (both '1' or both '0'), the comparator is rendered to a non-conducting state (e.g., open-drain state) so as to leave the match line unperturbed. By this operation, the match line is pulled to a logic low state to signal a mismatch if any one or more search elements within the debug vector search field detects an unmasked mismatch and, conversely, the debug vector search field leaves the match line unperturbed (e.g., otherwise pulled high) if no unmasked mismatches are signaled by in any individual search elements—the debug vector "matching" the search vector in the latter case. In alternative embodiments (within all compare circuits discussed herein, including state-subfield compare and range match compare), logic circuitry (logic gates) may be provided to actively drive the match line to either an asserted (hit) or deasserted (miss) state based on a logical combination individual compare signals instead of the match-line pull-up, with selective pull-down through mismatching bit-comparator circuits.

Within the state subfield compare block 189, multi-bit comparators 201 are selectively enabled by locally stored state-compare enable bits 203 to compare an entry-stored multi-bit search-state value 205 with respective entries of state table conveyed via respective sets of compare lines 181 (16 state table entries in the depicted example: ste[0], ste[1], . . . ste[15]), generating respective comparator outputs that are logically ORed within NOR gate 207 to produce an active-low state-table match signal at the gate of pull-down transistor 209. The state-compare-enable bits (203) are themselves logically ORed within OR gate 211 to render an active-low state-compare disable signal at the gate of compare-enable transistor 213. Through this arrangement, if no state table comparisons are enabled (e.g., all state-compare enable bits low), the output of OR gate 211 will be low, switching off transistor 213 and thereby disabling any match line pull-down (masking any state-compare mismatch). Conversely, if at least one state-table comparison is enabled (e.g., at least one state-compare enable bit high to switch transistor 213 to a conducting state), state-table comparison is enabled, and the output of logic NOR gate will either be low to signal a state match and leave match line unperturbed (i.e., at least one enabled comparator 201 signals a match so that the entry-stored search state at 205 matches at least one locally-enabled state table entry) or high to signal a mismatch (no enabled comparator signals a match between corresponding state table entry and search state value), in the latter case switching on transistor 209 such that match line is pulled down (i.e., coupled to ground via series coupled transistors 209 and 211). Accordingly, if all unmasked bits of the search vector match corresponding bits of the incoming debug vector, the state value stored in association with the search vector (i.e., search state 205) matches selectively-enabled entries (if any) of the state table (or none of the state table entries are enabled to be compared with the search state), and entry enable circuit 191 is configured in a compare-enable state (e.g., storing an entry enable/disable bit in a logic state that leaves the match line unperturbed), the match line will remain asserted throughout the search cycle to signal a state-qualified debug vector match. Conversely, if the entry enable/disable bit is stored in disable logic state (e.g., pulling the match line low), or any unmasked bit of the search vector does not match the corresponding debug vector bit or, if state-table compare is enabled, the search state stored in association with the search vector does not match any enabled state table entries, the match line will be pulled low to disqualify the entry from affecting the search result for the subject search cycle.

Still referring to FIG. 2, each of the range match entries includes a state subfield 215 and entry enable circuit 217 (e.g., both implemented and operating as discussed above with respect to like named counterparts within mask match entries) together with a dbv-range subfield 219, the latter including circuitry to determine whether a selected subcomponent of the incoming debug vector—referred to herein as a "dbv chunk"—falls between pre-stored upper and lower bounds and thus within a prescribed range of values. In the depicted example, the dbv-range subfield within each range mask entry includes a three-bit chunk selector storage 'CS' to select one of eight 32-bit chunks of an incoming 256-bit debug vector via multiplexer 221, a 32-bit chunk mask storage (C-Mask) to selectively zero out selected bits of the selected debug-vector chunk via mask circuit 223, and lower bound storage (LB) and upper bound storage (UB) that collectively define the search range. In the conceptual implementation shown, the lower and upper search bounds are compared with the masked debug vector chunk (mdbvc) within respective digital comparators 225, 227 to produce respective in-bound signals collectively indicating whether the masked dbv chunk is within the range defined by the lower and upper search bounds (e.g., less than or equal to the upper bound and greater than or equal to the lower bound, though non-inclusive ranges may also be assessed), asserting a logic-low in-range signal via logic NAND gate 229 if so. If the masked dbv chunk falls outside the range defined by bounding values LB/UB, one of comparators 225, 227 will deassert a within-bound output, driving output of NAND gate 229 high (signaling an out of bound debug-vector) and thus switching on pull-down transistor 231 to pull match line (ML) low. Accordingly, the match line for a given range match entry (otherwise pulled up to a logic high state, for example, through an unshown pull-up load) will be pulled low to disqualify the entry from affecting the search result in a given search cycle (i.e., signaling a miss) if (i) the selected, masked dbv chunk is outside the debug-vector search range, (ii) the entry is disabled (i.e., entry enable/disable bit stored in disable logic state) or (iii) the search state value stored with the range-match entry does not match any compare-enabled state-table entries (i.e., when state-table search is enabled as discussed above). Conversely, an enabled range-match entry will signal a hit (e.g., match line high) if the selected, masked debug vector chunk falls within the search range (i.e., is a value between the stored upper and lower bounds) and either state-table search is disabled altogether or the state value stored within the range-match entry matches a state table entry.

In the FIG. 2 embodiment, the match line outputs of the mask match and range match circuits are supplied to match encoder 169 which, in response, asserts a search "hit" signal if at least one of the match lines remains high during a given search cycle to signify a debug vector match detection, and otherwise deasserts the hit signal to signal a miss. In the case of a search hit, match encoder 169 additionally generates a match address (or match index) corresponding to a highest priority one of possibly multiple hit-indicating match lines (e.g., according to fixed or programmable priority of the mask-match/range match entries). As shown, the search hit signal is supplied to controller 173, while the match address (Addr) is applied to action lookup table (LUT) 171 to effect an action lookup—retrieving and delivering to controller 173 an action vector corresponding to the highest priority debug vector match. Controller 173, in turn, responds to the search hit indication by executing one or more operations specified by the corresponding action vector. In the depicted example shown in detail view 240, for instance, each action vector includes a set of fields corresponding to various executable actions including, for example, and without limitation, a trigger-enable field (enTR), session-stop field (stop), store hit debug vector field (stHV), disable hit debug vector field (dHV), entry update field (uEnt) and entry-update control fields (ei, owf, u-content, and ui). The trigger-enable and session-stop fields, when set (e.g., to a logic '1' bit state), instruct controller 173 to transition from its current state to a trigger state or a idle state, respectively, while the store hit dbv and disable hit dbv fields, when set, instruct the controller to take action with respect to the debug vector and/or matching dbv entry that yielded the search hit: enabling storage (within debug vector memory) of the debug vector (stHV) or disabling the mask match/range match entry that yielded the hit (dHV)—i.e., the entry corresponding to the match address.

In the FIG. 2 example, a multi-bit update-entry field (uEnt) within each action vector specifies one of several possible revisions with respect to a specified entry (indicated by entry index "ei" within the same action vector) within the mask match/range match circuit blocks including, for example and without limitation: enabling an entry (i.e., setting the entry-enable circuit 191/217 within the ei-specified entry to an enable state), disabling an entry (setting the entry-enable circuit to a disable state), updating/overwriting contents within the ei-specified entry with data supplied within the action vector itself (within the update-content (u-content) field of the action vector) or with content stored within configuration registers 137, updating/overwriting contents within the ei-specified entry with content drawn from the debug vector that yielded the hit (e.g., with uEnt field specifying one or more sub-fields within the hit-dbv to be copied into the ei-specified entry), enabling or disabling one or more state sub-fields within the ei-specified entry in accordance with the uEnt setting, etc. In one embodiment, the controller may write entire or fractional parts of any subfield within the mask match and range match entries (or all content within a given entry), with an overwrite field ("owf") within the action vector specifying the starting offset and run-length of the entry bits to be overwritten. Also, in a number of implementations, configuration registers 137 contain an image of the mask match and range match entry contents (e.g., debug vector and state subfield data—including mask and state-search enable bits—for each mask match entry; chunk-select, chunk mask, range upper/lower bound values, and state subfield data for each range match entry, entry-enable bits, etc.) that may be used to (i) populate the mask match and range match entries at host IC (and/or debug session) startup, (ii) copy contents, in effect, from one entry to another entry (e.g., copying contents from a mask match entry into upper and/or lower bound storage elements within a range match entry) by reading action-specified content from the configuration register image to an action-specified destination entry (with, for example, the owf field specifying bit offsets within the source and destination entries). As a more specific example, an action may instruct copying bits n to n+31 of a given mask match entry to the lower bound storage register (LB) within a given range match entry, with the configuration register image acting as the source of the copied bits. In other embodiments, one or more additional sub-fields within the action vector may specify copying content directly from one entry to another within match match/range match circuitry (i.e., instead of leveraging an image of mask match/range match content stored within configuration registers 137). In all such cases, the controller may occasionally overwrite all or any contents within the mask match, range match, state table, action table and/or configuration registers in response to host instructions received via I/O port 139 (e.g., overwriting content stored within analyzer with operand data supplied with or specified by such instructions—such host instructions having been generated within the host IC and/or received from a source external to the host IC, for example via a JTAG interface, serial interface, run-time interface or any other practicable signaling interface). Moreover, while the exemplary action vector organization shown in FIG. 2 emphasizes updates within the mask match and range match entries, the action vector may additionally or alternatively include information that specifies updates to state table 167, action lookup table 171 and/or configuration registers 137, the latter, for example, to dynamically change the vector selection signals issued to the functional circuit blocks (VectSel) and/or revise configuration register content that may then be copied in whole or part into the mask match, range match, state table, action LUT, etc.).

In the FIG. 2 embodiment, match encoder 169 may include one or more match configuration registers 243 that specify conditions for match signaling beyond solitary search-vector match—for example, requiring an incoming debug vector to match a specified set of (or all) enabled search vectors. Such multi-vector matching may be, for example, programmed within the match configuration registers by controller 173 (e.g., issuing a multi-vector control setting "Multi-Vect" that specifies search vectors to be, in effect, logically ANDed and optionally the action vector to be output in response to such multi-vector hit). Alternatively, match encoder may implement multi-vector matching without internal register programming, carrying out any vector-combined searching in response to the multi-vector control setting output from controller 173. Also, though not specifically shown in FIG. 2, each of the entries within mask match engine 161 may include storage for configuration data that specifies/controls slot-based hit signal assertion—signaling a the debug vector subfield match in accordance with a specified logical combination of matched slots within the debug vector subfield (e.g., logical ANDing of any subset of the four 64-bit slots within a 256-bit debug search field; logical ORing of any number of the constituent slots; logical NANDing, NORing and/or any useful combination of Boolean operations with respect to individual slots).

Figure 3:
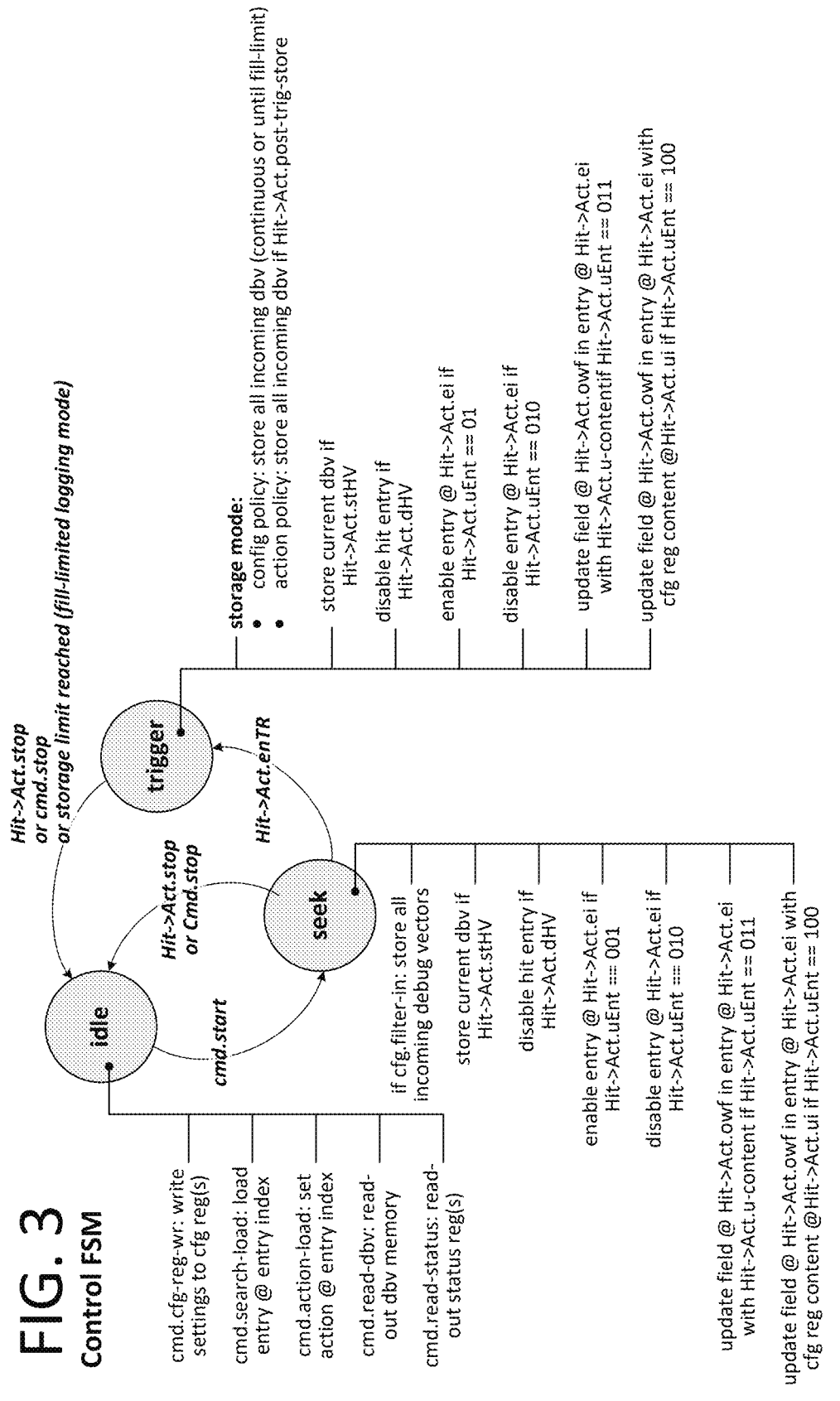
FIG. 3 illustrates an exemplary set of operating states, state transitions and resident-state actions that may be implemented within cascading analyzer embodiments of FIGS. 1 and 2.

FIG. 3 illustrates an exemplary set of operating states, state transitions and resident-state actions that may be implemented within respective controller components 135/173 of the FIG. 1/FIG. 2 cascading analyzer embodiments. As shown, the controller may be rendered to one of at least three operating states including an "idle" state used to pre-configure analyzer operation and read out analyzer content (i.e., from status registers and/or debug memory); a "seek" state in which the analyzer actively searches for debug vectors meeting match engine criteria (i.e., mask match and/or range match, with selective state-match qualification as discussed); and a "trigger" state in which storage of the debug vector stream commences (or continues in the case of a filter-in configuration as discussed below). In the idle state, the controller (implemented by a finite state machine in this example) carries out analyzer configuration and read-out operations specified by various incoming host commands (designated by "cmd.<instructed action>"), including for example and without limitation:

cmd.cfg-reg-wr: write settings to specified configuration registers (settings and/or register(s) specified, for example, by operand data supplied to the analyzer with the configuration-register write command)

cmd.search-load: load search vector (e.g., data, mask, range bounds, state and or state-table-entry enable) into a specified entry or entries within match engine (e.g., search vector content and specification of match-engine entries to be populated being included within or specified by operand data supplied with command)

cmd.action-load: load action vector into a specified action-LUT entry or entries (e.g., action vector content and LUT entries to be populated being included within or specified by operand data supplied with command)

cmd.read-dbv: read out debug vector memory (e.g., reading out all entries or selected range of entries within debug vector memory)

cmd.read-status: read out content of one or more status registers

Upon transitioning from the idle state to the seek state (i.e., in response to a start command—cmd.start), the controller commences a real time search for debug vectors that match entries within the match engine (mask match and/or range match), responding to search hit signals by executing actions indicated by the corresponding action vector. When an action vector specifies a transition to the trigger state, the controller makes that transition, logging incoming debug vectors upon entering the trigger state and remaining in that state until either commanded by the host to stop (cmd.stop), detecting a debug vector match for which the corresponding action specifies stop search (designated by the notation "Hit.Act.stop", where "Hit→Act.<subfield>" refers to a subfield within the action vector that accompanies a hit signal assertion), or, when in a fill-limited data logging mode, detecting that the debug vector memory has been filled to a storage limit—in all three instances transitioning back to the idle state as shown.

While in the seek state, the controller optionally enables continuous pre-trigger debug-vector storage within debug vector memory in accordance with a filter-in policy—for example, storing debug vectors continuously throughout the seek mode operation (operating the debug memory as a ring buffer through which the storage pointer continuously circulates) and then transitioning to either continuous or fill-limited (non-continuous) vector logging within the trigger mode (in the latter case, for example, capturing debug vectors until the storage pointer reaches a specified modulo offset relative to its value at the transition from seek state to trigger state). In any case, so long as active debug vector searching is ongoing (i.e., within the seek state or trigger state), the controller executes various actions specified by the action vectors associated with search hit events including, for example, and without limitation:

storing the debug vector that triggered the hit (shown in FIG. 3 by the designation Hit→Act.stHV, meaning that the stHV field is nonzero in the action vector for the search entry that yielded the debug vector hit)

disabling the search vector that yielded the debug vector hit (Hit→Act.dHV is nonzero)

enabling or disabling the search vector specified within the hit-indexed action vector (e.g., the search vector specified by Hit→Act.ei) if the update-entry code within that action vector specifies an entry-enable or entry-disable operation (i.e., Hit→Act.uEnt==001 or Hit→Act.uEnt==010)

updating the search vector specified within the hit-indexed action vector (i.e., search vector at Hit→Act.ei) with content at Hit→Act.u-content (e.g., writing some or all of that content into a subfield of the search vector specified by Hit→Act.owf) if Hit→Act.uEnt==011 updating the search vector at Hit→Act.ei with configuration register content at Hit→Act.ui (e.g., writing some or all of that content into the search vector field specified by Hit→Act.owf) if Hit→Act.uEnt==100

Figures 4, 5, 6:
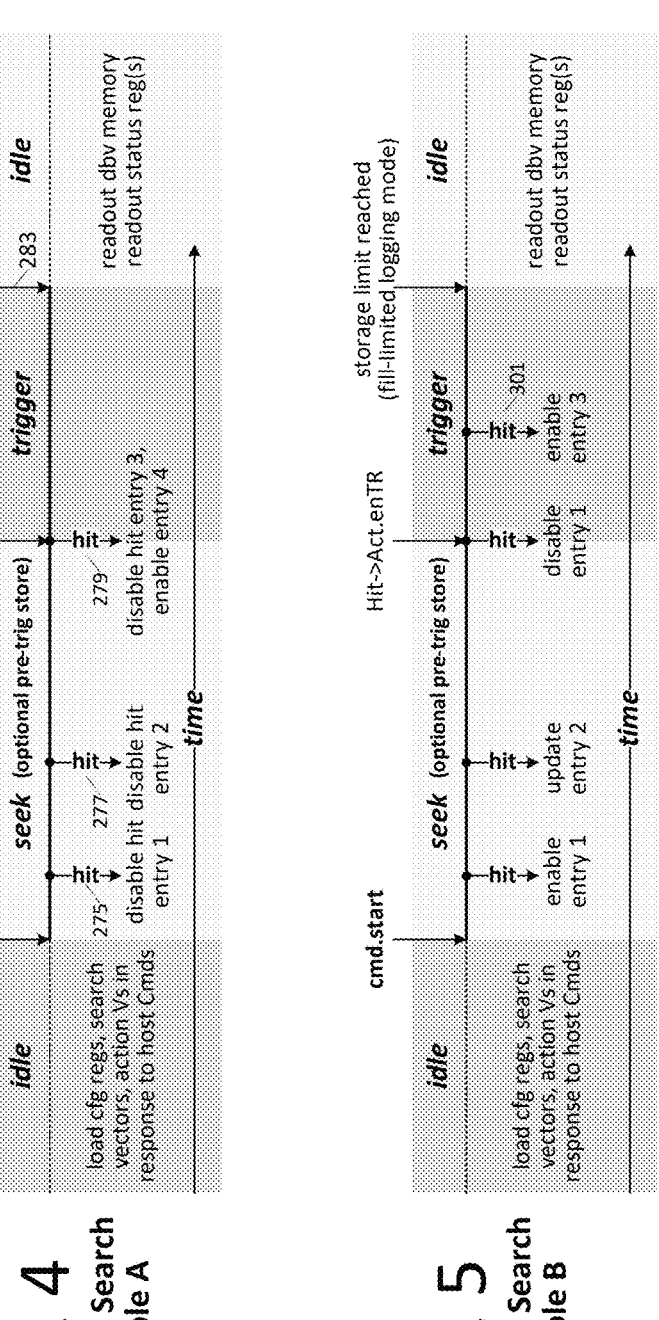
FIGS. 4, 5 and 6 illustrated non-exhaustive examples of various cascaded-scenario debugging sequences that may be implemented within the cascading analyzer embodiments discussed in reference to FIGS. 1-3.

FIGS. 4, 5 and 6 illustrated non-exhaustive examples of various cascaded-scenario searching that may be implemented within the cascading analyzer embodiments discussed above. In search example A (FIG. 4), configuration registers, search vectors and action vectors are loaded into the cascaded analyzer during an initial idle state 271. The analyzer then transitions to the seek state (273) in response to a host command (cmd.start), detecting two search hits (incoming debug vectors that match one or more search vectors within the match engine) at 275 and 277 before finally encountering a search hit (279) that transitions the analyzer to the trigger state (281). As shown, upon encountering the initial hit at 275, the analyzer (or more specifically the controller therein) disables the entry (entry 1) that yielded the hit (i.e., the action vector associated with entry 1 specifies that the entry is to be disabled when matched by an incoming debug vector), effectively establishing a new search scenario (one that lacks entry 1) from that point forward. Likewise at search hit 277—the associated action vector specifies that the hit-yielding search vector (entry 2) is to be disabled, thus effecting another new search scenario going forward. At the search hit 279, the hit-yielding search vector is disabled yet again (entry 3 this time), while another search entry (entry 4) is enabled—effecting a third new search scenario—as the controller transitions to the trigger state. The analyzer is configured for fill-limited (non-continuous) debug vector logging in the FIG. 4 example, so that upon reaching a storage limit at 283 (e.g., debug memory full), the controller returns to the idle state, enabling the debug memory and/or analyzer status registers to be read out for inspection/analysis. Reflecting on the FIG. 4 search timeline, a cascading sequence of four different search scenarios are met before commencing trigger-state debug vector logging, thus confining the logged vectors to those occurring after a precise and otherwise difficult to ascertain set of conditions has been satisfied. If configured for filter-in operation, the analyzer may commence debug vector logging upon entering the seek state, with some or all of that pre-trigger content constituting part of the total data log—together with various metadata—available during idle-state debug vector memory readout. Such metadata may include, for example, and without limitation, timestamp (indicating relative or absolute point in time at which a given search hit occurred), controller state, contents of matching search entry, index of match engine entry that yielded the search hit, index and/or value of state table entry that contributed to the search hit, and so forth (any or all of which may be programmably selected for inclusion in a logging entry by virtue of configuration register programming).

In the FIG. 5 cascaded-search example, three different search scenarios are again sequentially matched (i.e., search vector hit with match criteria update in each case) before the analyzer transitions to the trigger state, but with different actions executed at each search hit—first, disabling entry 1 (e.g., an entry specified by index 'ei' within the hit-associated action vector), then updating entry 2 (e.g., copying content from one mask match entry to a subfield within another mask match entry or into a range or mask field within a range match entry, etc.), and then disabling entry 1 upon entering the trigger state. In this instance, an additional scenario change occurs following a search hit at 301 after the trigger state has been entered, in this case enabling an additional entry (e.g., specified by the action vector index 'ei'). As in the FIG. 4 example, data logging ceases (and the analyzer reverts to the idle state) upon reaching a storage limit. In search example C shown in FIG. 6, the three cascaded scenarios shown in FIG. 4 are again implemented within the seek state (e.g., establishing an initial search scenario via idle-state configuration, disabling hit entry 1 at first search hit to effect a second search scenario, and disabling hit entry 2 to effect a third search scenario), followed by a transition to the trigger state in response to a search hit at 321. In this case however, instead of merely disabling the hit entry and enabling another entry (as in the FIG. 4 example), content within entry 3 is updated (e.g., overwritten with new content, for example, by copying a field from a mask match entry into the chunk-select mask, or upper/lower bound fields of a range match entry) to effect a fourth trigger-mode search scenario. Also, in this case, the analyzer is configured for continuous debug vector logging and thus continues storing debug vectors within the debug memory (e.g., after writing at a maximum dbv memory address, wrapping the storage pointer to a minimum dbv memory address to effect a circulating storage arrangement) until detecting a search hit at 323 for which the corresponding action vector specifies a return to the idle state (i.e., Hit→Act.stop field is nonzero). Numerous other examples may apply with any number of cascading search scenarios within the seek and/or search states.

Referring to FIGS. 1-6 generally, various alternative circuit architectures may implement the cascading analyzer embodiments described above (including match engine, controller and/or other components thereof) as well as the vector selection arrangement within the host integrated circuit. Also, the various analyzer embodiments presented herein may be implemented within a standalone integrated circuit component or IC package, or within one or more IC components (including packages having multiple IC dies). In the case of a multi-die package, components of the cascading analyzer may be deployed on the same IC die, or distributed across multiple IC dies (e.g., multiple instances of match engine and/or controller on respective IC dies, with shared debug vector memory on one or a subset of those IC dies; analyzer issues vector select signals to functional logic blocks on multiple dies with those blocks daisy-chained from one die to the next), or respective instances of the analyzer may be implemented on each or any constituent dies of the multi-die IC. In all such cases, individual analyzer control circuitry may be implemented by one or more programmed processors and/or dedicated hardware circuits (e.g., finite state machines, registered or combinational circuits, etc.). Additionally, hardware-level implementations of any or all of the various analyzer embodiments (and/or vector-selection circuitry within and extending between functional logic blocks and cascading analyzer) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, the various debug vector widths, logical slot sizes, chunk sizes, numbers of table entries, vector field or sub-field sizes, signaling path widths, constituent conductors per signal, host interface types, memory types, data-unit or symbol sizes (e.g., bits, bytes), and so forth are provided for purposes of example—any practicable alternatives may be implemented in all cases. Similarly, various interconnections between internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A logic analyzer embedded within an integrated-circuit (IC) component, the logic analyzer comprising:

a debug vector input to receive a stream of debug vectors from one or more circuit blocks within the integrated circuit component;

a first lookup table;

match circuitry to:

store a plurality of search vectors that collectively define a first debug-vector-match scenario, detect, as first match event, that a first debug vector within the stream of debug vectors matches a first search vector within the stored plurality of search vectors, and retrieve a first action value from the first lookup table using an address value corresponding to the first search vector; and control circuitry to execute one or more actions indicated by the first action value, including circuitry to revise information within at least one of the plurality of search vectors stored within the match circuitry such that, after revising the information, the plurality of search vectors stored within the match circuitry collectively define a second debug-vector-match scenario different from the first debug-vector-match scenario.

2. The logic analyzer of claim 1 wherein:

the match circuitry is additionally to detect, as a second match event, that a second debug vector, subsequent to the first debug vector within the stream of debug vectors, matches a second search vector within the plurality of search vectors, and, in response to the second match event, to retrieve a second action value from the first lookup table using an address value corresponding to the second debug vector; and the control circuitry is additionally to execute one or more actions indicated by the second action value.

3. The logic analyzer of claim 1 wherein the match circuitry to retrieve the first action value from the first lookup table using the address value corresponding to the first search vector comprises circuitry to generate the first address value based on a storage location of the first search vector within the match circuitry.

4. The logic analyzer of claim 1 wherein the match circuitry to detect that the first debug vector within the stream of debug vectors matches the first search vector comprises circuitry to compare each unmasked bit within the first search vector with a corresponding bit of the first debug vector.

5. The logic analyzer of claim 4 further wherein the control circuitry comprises circuitry to store the first search vector within the match circuitry including circuitry to store (i) a set of data bits in a pattern corresponding to a debug vector of interest and (ii) a set of mask bits that indicate, for each data bit within the set of data bits, whether the data bit constitutes an unmasked bit within the search vector.

6. The logic analyzer of claim 1 wherein the match circuitry to detect that the first debug vector within the stream of debug vectors matches the first search vector comprises comparator circuitry to determine that a numeric value represented by a first plurality of bits within the first debug vector falls within a range of values defined within the first search vector.

7. The logic analyzer of claim 6 wherein the match circuitry to detect that the first debug vector within the stream of debug vectors matches the first search vector further comprises circuitry to select, as the first plurality of bits, a subset of bits within the first debug vector according to bit-selection criteria stored within the first search vector.

8. The logic analyzer of claim 1 wherein the circuitry to revise information within at least one of the plurality of search vectors comprises circuitry to disable at least one search vector of the plurality of search vectors from being determined to match debug vectors subsequent to the first debug vector within the stream of debug vectors.

9. The logic analyzer of claim 1 wherein the match circuitry to store the plurality of search vectors comprises circuitry to store a plurality of enabled search vectors that may each yield a match detection with respect to one or more debug vector bit patterns, and at least one disabled search vector for which no debug vector bit pattern will yield a match detection, and wherein the circuitry to revise information within at least one of the plurality of search vectors comprises circuitry to enable the at least one disabled search vector to yield a match detection with respect to one or more debug vector bit patterns.

10. The logic analyzer of claim 1 wherein the circuitry to revise information within at least one of the plurality of search vectors comprises circuitry to overwrite contents within at least one search vector of the plurality of search vectors so that a first set of one or more debug vector bit patterns that would have matched the at least one search vector prior to overwriting the contents thereof is different from a second set of one or more debug vector bit patterns that would match the at least one search vector after overwriting the contents thereof.

11. A method of operation within a logic analyzer circuit embedded within an integrated-circuit (IC) component, the method comprising:

receiving a stream of debug vectors from one or more circuit blocks within the integrated circuit component;

detecting, as first match event, that a first debug vector within the stream of debug vectors matches a first search vector, the first search vector being one of a plurality of search vectors that are stored within the logic analyzer circuit and collectively define a first debug-vector-match scenario; and in response the first match event:

retrieving a first action value from a first lookup table using an address value corresponding to the first search vector, and executing one or more actions indicated by the first action value, including revising information within at least one of the plurality of search vectors stored within the logic analyzer circuit such that, after revising the information, the plurality of search vectors stored within the logic analyzer circuit collectively define a second debug-vector-match scenario different from the first debug-vector-match scenario.

12. The method of claim 11 further comprising:

detecting, as a second match event, that a second debug vector, subsequent to the first debug vector within the stream of debug vectors, matches a second search vector within the plurality of search vectors; and in response to the second match event, retrieving a second action value from the first lookup table using an address value corresponding to the second debug vector and executing one or more actions indicated by the second action value.

13. The method of claim 11 wherein retrieving the first action value from the first lookup table using the address value corresponding to the first search vector comprises generating the first address value based on a storage location of the first search vector within the logic analyzer circuit.

14. The method of claim 11 wherein detecting that the first debug vector within the stream of debug vectors matches the first search vector comprises determining that each unmasked bit within the first search vector matches a corresponding bit of the first debug vector.

15. The method of claim 14 further comprising storing the first search vector within the logic analyzer circuit including storing (i) a set of data bits in a pattern corresponding to a debug vector of interest and (ii) a set of mask bits that indicate, for each data bit within the set of data bits, whether the data bit constitutes an unmasked bit within the search vector.

16. The method of claim 11 wherein detecting that the first debug vector within the stream of debug vectors matches the first search vector comprises determining that a numeric value represented by a first plurality of bits within the first debug vector falls within a range of values defined within the first search vector.

17. The method of claim 16 wherein detecting that the first debug vector within the stream of debug vectors matches the first search vector further comprises selecting, as the first plurality of bits, a subset of bits within the first debug vector according to bit-selection criteria stored within the first search vector.

18. The method of claim 11 wherein revising information within at least one of the plurality of search vectors comprises disabling at least one search vector of the plurality of search vectors from being determined to match debug vectors subsequent to the first debug vector within the stream of debug vectors.

19. The method of claim 11 wherein the plurality of search vectors stored within the logic analyzer circuit comprise a plurality of enabled search vectors that may each yield a match detection with respect to one or more debug vector bit patterns, and at least one disabled search vector for which no debug vector bit pattern will yield a match detection, and wherein revising information within at least one of the plurality of search vectors comprises enabling the at least one disabled search vector to yield a match detection with respect to one or more debug vector bit patterns.

20. The method of claim 11 wherein revising information within at least one of the plurality of search vectors comprises overwriting contents within at least one search vector of the plurality of search vectors so that a first set of one or more debug vector bit patterns that would have matched the at least one search vector prior to overwriting the contents thereof is different from a second set of one or more debug vector bit patterns that would match the at least one search vector after overwriting the contents thereof.

21. A logic analyzer embedded within an integrated-circuit (IC) component, the logic analyzer comprising:
an input to receive a stream of debug vectors from one or more circuit blocks within the integrated circuit component;
a first lookup table;
means for:
storing a plurality of search vectors that collectively define a first debug-vector-match scenario,
detecting, as first match event, that a first debug vector within the stream of debug vectors matches a first search vector within the stored plurality of search vectors, and
retrieving a first action value from the first lookup table using an address value corresponding to the first search vector; and
means for executing one or more actions indicated by the first action value, including revising information within at least one of the stored plurality of search vectors such that, after revising the information, the stored plurality of search vectors stored collectively define a second debug-vector-match scenario different from the first debug-vector-match scenario.

* * * * *